United States Patent
Fan et al.

Patent Number: 6,124,212
Date of Patent: Sep. 26, 2000

[54] HIGH DENSITY PLASMA (HDP) ETCH METHOD FOR SUPPRESSING MICRO-LOADING EFFECTS WHEN ETCHING POLYSILICON LAYERS

[75] Inventors: Yuh-Da Fan, Miao-Li; Weng-Liang Fang, Hsin-Chu, both of Taiwan

[73] Assignee: Taiwan Semiconductor Manufacturing Co., Hsin-Chu, Taiwan

[21] Appl. No.: 08/947,828

[22] Filed: Oct. 8, 1997

[51] Int. Cl.[7] .................................................. H01L 21/302
[52] U.S. Cl. .......................... 438/709; 438/710; 438/711; 438/714
[58] Field of Search .................................... 438/708, 710, 438/711, 714

[56] References Cited

U.S. PATENT DOCUMENTS

| | | | |
|---|---|---|---|
| 4,948,462 | 8/1990 | Rossen | 156/643 |
| 5,198,384 | 3/1993 | Dennison | 437/47 |
| 5,254,213 | 10/1993 | Tamaki | 156/655 |
| 5,269,879 | 12/1993 | Rhoades et al. | 156/643 |
| 5,427,963 | 6/1995 | Richart et al. | 437/41 |
| 5,449,639 | 9/1995 | Wei et al. | 437/187 |
| 5,817,562 | 10/1998 | Chang et al. | 438/305 |
| 5,895,239 | 4/1999 | Jeng et al. | 438/239 |

*Primary Examiner*—Edward J. Cain
*Attorney, Agent, or Firm*—George O. Saile; Stephen B. Ackerman

[57] ABSTRACT

A method for forming a patterned polysilicon layer within a microelectronics fabrication. There is first provided a substrate layer employed within a microelectronics fabrication. There is then formed upon the substrate layer a blanket polysilicon layer. There is then formed upon the blanket polysilicon layer a blanket organic polymer layer. There is then formed upon the blanket organic polymer layer a patterned photoresist layer, where the patterned photoresist layer has a high areal density region and a low areal density region. There is then etched through a first plasma etch method while employing the patterned photoresist layer as an etch mask layer the blanket organic polymer layer to form a patterned organic polymer layer while reaching the blanket polysilicon layer. The patterned organic polymer layer has a high areal density region corresponding with the high areal density region of the patterned photoresist layer and a low areal density region corresponding with the low areal density region of the patterned photoresist layer. The blanket polysilicon layer also has formed thereupon an organic polymer residue layer within portions of the low areal density region of the patterned organic polymer layer. The first plasma etch method employs a first etchant gas composition comprising an oxygen containing species, a nitrogen containing species and a bromine containing species. There is then etched through a second plasma etch method while employing at least the patterned organic polymer layer as an etch mask layer the blanket polysilicon layer to form the patterned polysilicon layer, while suppressing a microloading effect.

24 Claims, 7 Drawing Sheets

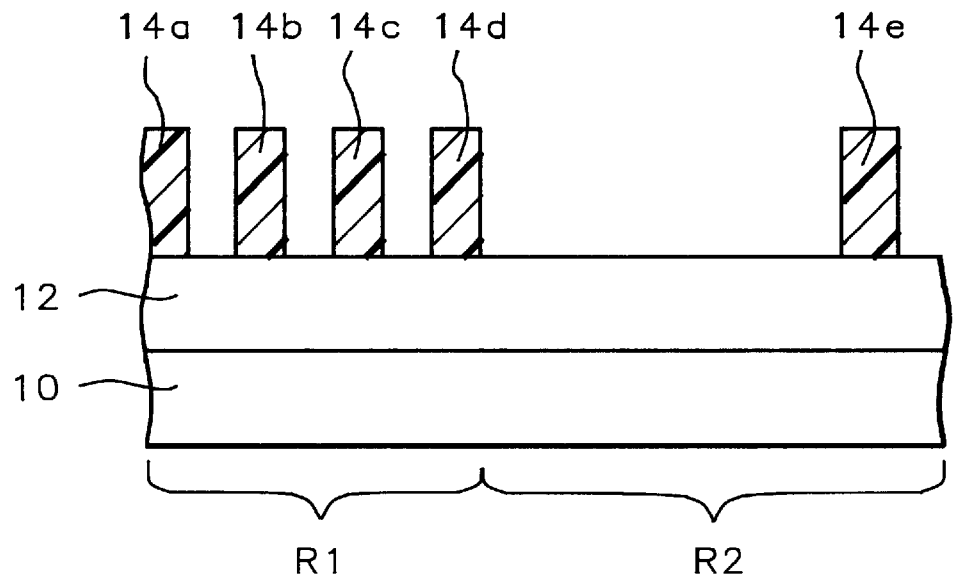
*FIG. 1 - Prior Art*
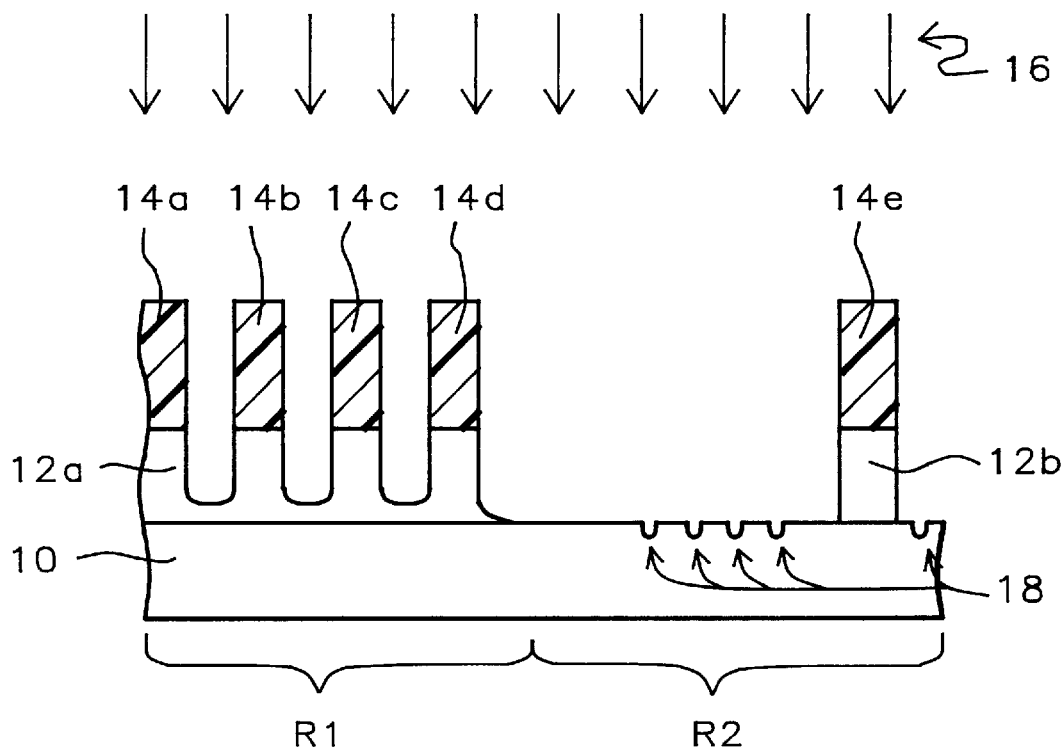
*FIG. 2 - Prior Art*

HIGH DENSITY PLASMA (HDP) ETCH METHOD FOR SUPPRESSING MICRO-LOADING EFFECTS WHEN ETCHING POLYSILICON LAYERS

BACKGROUND OF THE INVENTION

1. Field of the Invention

The present invention relates generally to methods for etching polysilicon layers within microelectronics fabrications. More particularly, the present invention relates to methods for globally etching polysilicon layers within microelectronics fabrications.

2. Description of the Related Art

As microelectronics fabrication device and structure dimensions have decreased and microelectronics substrate dimensions have increased, it has become increasingly more difficult to form through plasma etch methods within microelectronics fabrications patterned layers, such as patterned polysilicon layers, with uniform dimensions at various locations across a microelectronics substrate. Such patterned layers are even more difficult to form with uniform dimensions at various locations across a microelectronics substrate when such patterned layers are formed with multiple areal densities across the microelectronics substrate. Such dimensional non-uniformity of plasma etched patterned layers within microelectronics fabrications, including a plasma etched patterned polysilicon layer within a microelectronics fabrication, as a function of areal density of the patterned layer over a microelectronics substrate is commonly referred to as a micro-loading effect. A pair of schematic cross-sectional diagrams illustrating such a micro-loading effect is shown by FIG. 1 and FIG. 2.

Shown in FIG. 1 is a substrate 10 employed within a microelectronics fabrication. The substrate 10 has formed thereupon a blanket layer 12 which in turn has formed thereupon a series of patterned photoresist layers 14a, 14b, 14c, 14d and 14e, where the patterned photoresist layers 14a, 14b, 14c and 14d are formed into a high areal density region R1 over the substrate 10 while the patterned photoresist layer 14e is formed into a low areal density region R2 over the substrate 10. The series of patterned photoresist layers 14a, 14b, 14c, 14d and 14e is employed as a photoresist etch mask in forming a series of patterned layers from the blanket layer 12.

Referring now to FIG. 2, there is shown a schematic cross-sectional diagram illustrating the results of further processing of the substrate 10 whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the blanket layer 12 has been etched within a plasma 16 while employing the patterned photoresist layers 14a, 14b, 14c, 14d and 14e as a photoresist etch mask layer. As is illustrated in FIG. 1, within the high areal density region R1 of the patterned photoresist layers the blanket layer 12 is under-etched in forming the incompletely etched patterned layer 12a, while in the low areal density region R2 of the patterned photoresist layers the patterned layer 12b is completely etched from the blanket layer 12, but there is sustained over-etch damage to the substrate 10 in the form of micro-trenches 18.

It is thus in general towards forming through plasma etch methods within microelectronics fabrications patterned layers with areal density variations while suppressing a micro-loading effect when forming those patterned layers within those microelectronics fabrications that the present invention is generally directed. Since it is quite common within microelectronics fabrications to form with substantial variations in areal density patterned polysilicon layers from blanket polysilicon layers within those microelectronics fabrications, it is more specifically towards forming through plasma etch methods within microelectronics fabrications patterned polysilicon layers with areal density variations while suppressing a micro-loading effect when forming those patterned polysilicon layers within those microelectronics fabrications that the present invention is more specifically directed.

With more particular regard to integrated circuit microelectronics fabrications, such plasma etch methods are commonly employed to form from blanket polysilicon layers patterned polysilicon layers with high areal density regions which form polysilicon gate electrodes and local interconnects associated with closely spaced field effect transistors (FETs), while simultaneously forming patterned polysilicon layers with low areal density regions forming global interconnects, such as bond pads.

Various novel plasma etch methods have been disclosed in the arts of microelectronics fabrication for forming patterned structures and patterned layers within microelectronics fabrications.

For example, Rossen, in U.S. Pat. No. 4,948,462 discloses a plasma etch method for forming from a blanket tungsten layer within an integrated circuit microelectronics fabrication a patterned tungsten layer within the integrated circuit microelectronics fabrication, where the patterned tungsten layer is formed while suppressing a lateral undercutting of the patterned tungsten layer beneath a patterned photoresist layer employed as a photoresist etch mask in forming the patterned tungsten layer. The plasma etch method employs an etchant gas composition comprising sulfur hexafluoride, nitrogen and chlorine.

In addition, Tamaki, in U.S. Pat. No. 5,254,213, discloses a reactive ion etch (RIE) plasma etch method for forming a contact window through a dielectric layer to access an underlying aluminum containing conductor layer within a microelectronics fabrication, where the contact window is etched through the dielectric layer while simultaneously suppressing sputtering of the aluminum containing conductor layer. The reactive ion etch (RIE) plasma etch method employs an etchant gas composition comprising sufficient nitrogen gas such that the aluminum containing conductor layer when exposed to the etchant gas composition is sufficiently nitrided such that its sputtering within the reactive ion etch (RIE) plasma etch method is suppressed.

Similarly, Rhoades et al., in U.S. Pat. No. 5,269,879, discloses a method for etching a silicon oxide, a silicon nitride or a silicon oxynitride dielectric layer in the presence of an aluminum, a titanium or a molybdenum containing conductor layer within an integrated circuit microelectronics fabrication, while avoiding sputtering of the conductor layer. The method employs a plasma simultaneously comprising sufficient fluorine containing species to etch the silicon oxide, the silicon nitride or the silicon oxynitride layer and sufficient nitrogen to suppress sputtering of the aluminum, the titanium or the molybdenum containing layer.

Finally, Wei et al., in U.S. Pat. No. 5,449,639, discloses a composite dry plasma etch/wet chemical etch method for forming from a blanket conductor metal layer within an integrated circuit microelectronics fabrication a patterned conductor metal layer within the integrated circuit microelectronics fabrication. The method employs a sacrificial anti-reflective coating (ARC) layer which attenuates reflections from the blanket conductor metal layer when forming the patterned conductor metal layer, while simultaneously serving as a removable layer which protects the patterned metal layer from wet chemical etchant induced corrosion.

Desirable in the art of microelectronics fabrication are additional plasma etch methods through which blanket polysilicon layers may be patterned to form patterned polysilicon layers within microelectronics fabrications, where the patterned polysilicon layers simultaneously have high areal density patterned polysilicon layer regions and low areal density patterned polysilicon layer regions, while suppressing a micro-loading effect when forming those patterned polysilicon layers. It is towards that goal that the present invention is directed.

SUMMARY OF THE INVENTION

A first object of the present invention is to provide a plasma etch method for forming a patterned polysilicon layer from a blanket polysilicon layer within a microelectronics fabrication.

A second object of the present invention is to provide a method in accord with the first object of the present invention where the patterned polysilicon layer is formed with a high areal density region and a low areal density region while suppressing a micro-loading effect when forming the patterned polysilicon layer.

A third object of the present invention is to provide a method in accord with the first object of the present invention or the second object of the present invention, where the microelectronics fabrication is an integrated circuit microelectronics fabrication.

A fourth object of the present invention is to provide a method in accord with the first object of the present invention, the second object of the present invention or the third object of the present invention, which method is readily manufacturable.

In accord with the objects of the present invention, there is provided by the present invention a method for forming a patterned polysilicon layer within a microelectronics fabrication. To practice the method of the present invention, there is first provided a substrate layer employed within a microelectronics fabrication. There is then formed upon the substrate layer a blanket polysilicon layer. There is then formed upon the blanket polysilicon layer a blanket organic polymer layer. There is then formed upon the blanket organic polymer layer a patterned photoresist layer, where the patterned photoresist layer has a high areal density region and a low areal density region. There is then etched through a first plasma etch method while employing the patterned photoresist layer as a photoresist etch mask layer the blanket organic polymer layer to form a patterned organic polymer layer, while reaching the blanket polysilicon layer. The patterned organic polymer layer has a high areal density region corresponding with the high areal density region of the patterned photoresist layer and a low areal density region corresponding with the low areal density region of the patterned photoresist layer. The blanket polysilicon layer also has formed thereupon an organic polymer residue layer within the low areal density region of the patterned organic polymer layer. The first plasma etch method employs a first etchant gas composition comprising an oxygen containing species, a nitrogen containing species and a bromine containing species. There is then etched through a second plasma etch method while employing at least the patterned organic polymer layer as an etch mask layer the blanket polysilicon layer to form a patterned polysilicon layer. The patterned polysilicon layer so formed has a high areal density region corresponding with the high areal density region of the patterned photoresist layer and a low areal density region corresponding with the low areal density region of the patterned photoresist layer.

The present invention provides a plasma etch method for forming a patterned polysilicon layer from a blanket polysilicon layer within a microelectronics fabrication, where the patterned polysilicon layer is formed with a high areal density region and a low areal density region, while suppressing a micro-loading effect when forming the patterned polysilicon layer. The method of the present invention realizes this object by employing when forming the patterned polyilicon layer from the blanket polysilicon layer a blanket organic polymer layer formed upon the blanket polysilicon layer, where the blanket organic polymer layer is patterned to form a patterned organic polymer layer having a high areal density region and a low areal density region while simultaneously forming upon portions of the blanket polysilicon layer within the low areal density region of the patterned organic polymer layer an organic polymer residue layer which assists in suppressing over-etching of the blanket polysilicon layer within the low areal density region of the patterned organic polymer layer while avoiding under-etching of the blanket polysilicon layer within the high areal density region of the patterned organic polymer layer.

The method of the present invention may be employed where the microelectronics fabrication is an integrated circuit microelectronics fabrication. The method of the present invention does not discriminate with respect to the nature of a microelectronics fabrication within which is formed a patterned polysilicon layer through the method of the present invention. Thus, although the method of the present invention is most likely to provide value when forming high areal density patterned polysilicon or polycide gate electrodes and associated high areal density patterned polysilicon or polycide local interconnects simultaneously with low areal density patterned polysilcon or polycide global interconnects within integrated circuit microelectronics fabrications, the method of the present invention may be employed when forming patterned polysilicon or patterned polycide layers within microelectronics fabrications including but not limited to integrated circuit microelectronics fabrications, solar cell microelectronics fabrications, ceramic packaging microelectronics fabrications and flat panel display microelectronics fabrications.

The method of the present invention is readily manufacturable. As is illustrated within the Description of the Preferred Embodiment which follows, the method of the present invention employs microelectronics fabrication materials and plasma etch methods which are generally known in the art of microelectronics fabrications. Thus, the method of the present invention is readily manufacturable.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein:

FIG. 1 and FIG. 2 show a pair of schematic cross-sectional diagrams illustrating patterned polysilicon layer high areal density region under-etching and patterned polysilicon layer low areal density region over-etching due to a micro-loading effect when forming a patterned polysilicon layer through a plasma etch method conventional in the art of microelectronics fabrication.

DESCRIPTION OF THE PREFERRED EMBODIMENTS

The present invention provides a plasma etch method for forming a patterned polysilicon layer from a blanket polysilicon layer within a microelectronics fabrication, where the patterned polysilicon layer is formed with a high areal density region and a low areal density region, while suppressing a micro-loading effect when forming the patterned polysilicon layer. The method of the present invention realizes this object by employing when forming the patterned polyilicon layer a blanket organic polymer layer formed interposed between: (1) a blanket polysilicon layer from which is formed the patterned polysilicon layer; and (2) a patterned photoresist layer which is employed as an etch mask layer in defining the patterned polysilicon layer. The patterned photoresist layer has a high areal density region and a low areal density region. While employing the patterned photoresist layer as the etch mask layer, the blanket organic polymer layer is patterned to form a patterned organic polymer layer having a high areal density region and a low areal density region corresponding with the high areal density region of the patterned photoresist layer and the low areal density region of the patterned photoresist layer, while simultaneously forming upon the blanket polysilicon layer within the low areal density region of the patterned organic polymer layer an organic polymer residue layer which assists in suppressing over-etching of the blanket polysilicon layer within the low areal density region of the patterned organic polymer layer while avoiding under-etching of the blanket polysilicon layer within the high areal density region of the patterned organic polymer layer. Thus, there may be formed a patterned polysilicon layer having a high areal density region and a low areal density region while suppressing a micro-loading effect when forming the patterned polysilicon layer.

First Preferred Embodiment

Figure 3:
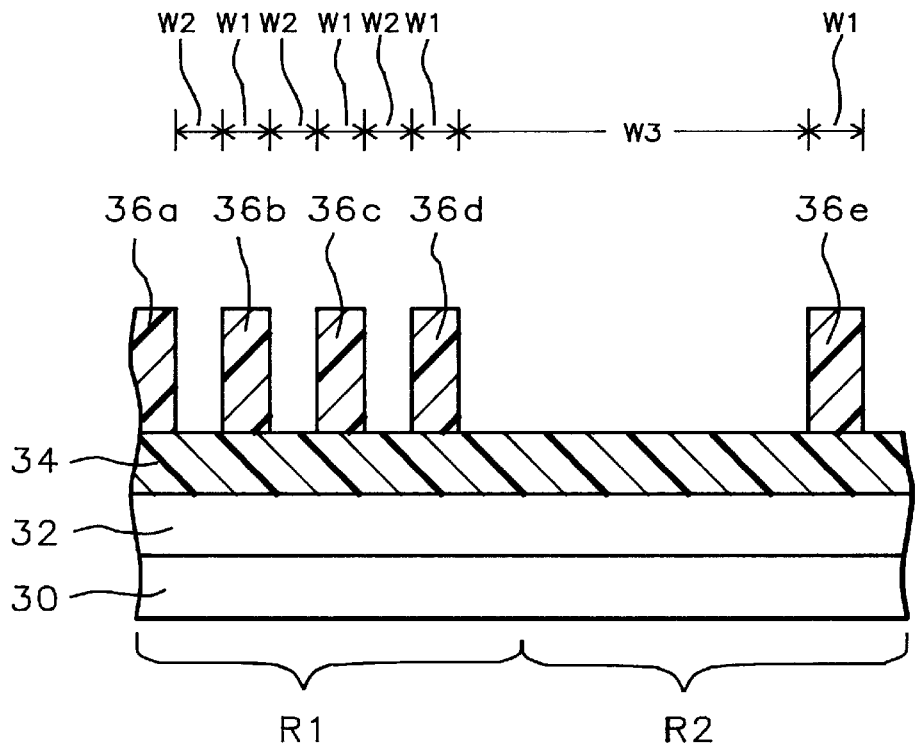
FIG. 3 to FIG. 7 show a series of schematic cross-sectional diagrams illustrating the results of progressive stages in forming within a microelectronics fabrication a patterned polysilicon layer having a high areal density region and a low areal density region, while suppressing a micro-loading effect when forming the patterned polysilicon layer, in accord with a general preferred embodiment of the present invention which comprises the first preferred embodiment of the present invention.

Referring now to FIG. 3 to FIG. 7, there is shown a series of schematic cross-sectional diagrams illustrating the results of progressive stages in forming in accord with a general preferred embodiment of the present invention a patterned polysilicon layer within a microelectronics fabrication, where the patterned polysilicon layer has a high areal density region and a low areal density region, while suppressing a micro-loading effect when forming the patterned polysilicon layer. The general preferred embodiment of the present invention, as illustrated within FIG. 3 to FIG. 7, comprises a first preferred embodiment of the present invention. Shown in FIG. 3 is a schematic cross-sectional diagram of the microelectronics fabrication at an early stage in its fabrication.

Shown within FIG. 3 is a substrate layer 30 having formed thereupon a blanket polysilicon layer 32. Within the schematic cross-sectional diagram of FIG. 3, the substrate layer 30 is a substrate layer employed within a microelectronics fabrication, such as but not limited to an integrated circuit microelectronics fabrication, a solar cell microelectronics fabrication, a ceramic packaging microelectronics fabrication or a flat panel display microelectronics fabrication. Although not specifically illustrated by the schematic cross-sectional diagram of FIG. 3, the substrate layer 30 may be the substrate employed within the microelectronics fabrication, or alternatively, the substrate layer 30 may also include a layer or layers formed upon or over the substrate employed within the microelectronics fabrication. Thus, within the first preferred embodiment of the present invention the substrate layer 30 is intended to represent both substrates alone and substrates having intervening layers formed thereupon and thereover. Appropriate substrates and substrate layers are generally known within the various microelectronics fabrication arts noted above. Such substrates and substrate layers may include, but are not limited to conductor substrates, semiconductor substrates, dielectric substrates, conductor substrate layers, semiconductor substrate layers and dielectric substrate layers.

With regard to the blanket polysilicon layer 32, methods and materials through which blanket polysilicon layers may be formed within microelectronics fabrications are known in the arts of microelectronics fabrication. Blanket polysilicon layers may be formed within microelectronics fabrications through methods including but not limited to chemical vapor deposition (CVD) methods, plasma enhanced chemical vapor deposition (PECVD) methods and physical vapor deposition (PVD) sputtering methods through which may be formed from suitable silicon source materials with appropriate optional dopant source materials both doped and undoped blanket polysilicon layers. For the first preferred embodiment of the present invention, the blanket polysilicon layer 32 is preferably formed of a doped polysilicon material formed upon the substrate layer 30 through any of the foregoing deposition methods, preferably to a thickness of from about 500 to about 3000 angstroms.

Shown also within FIG. 3 formed upon the blanket polysilicon layer 32 is a blanket organic polymer layer 34. Methods and materials through which blanket organic polymer layers may be formed within microelectronics fabrications are known in the arts of microelectronics fabrication. Blanket organic polymer layers may be formed within microelectronics fabrications through methods including but not limited to spin coating methods, roll coating methods, vapor coating methods and laminating methods through which may be formed blanket organic polymer layers of organic polymer materials including but not limited to planarizing organic polymer materials, encapsuling organic polymer materials and anti-reflective dyed organic polymer materials. For the first preferred embodiment of the present invention, the blanket organic polymer layer 34 is preferably formed of an anti-reflective dyed organic polymer material, such as but not limited to a dyed polyimide polymer material or a dyed non-photoreactive resist polymer material, formed upon the blanket polysilicon layer 32 to a thickness of from about 1000 to about 2000 angstroms.

Finally, there is also shown in FIG. 3 a series of patterned photoresist layers 36a, 36b, 36c, 36d and 36e formed upon the blanket organic polymer layer 34. Although it is known in the arts of microelectronics fabrication that patterned photoresist layers may be formed of photoresist materials selected from the general groups of photoresist materials including but not limited to positive photoresist materials and negative photoresist materials, for the fist preferred embodiment of the method of the present invention the series of patterned photoresist layers 36a, 36b, 36c, 36d and 36e is preferably formed of a positive photoresist material to provide positive photoresist layers 36a, 36b, 36c, 36d and 36e of optimal dimensional stability, although other methods and materials may also be employed in forming the series of patterned photoresist layers 36a, 36b, 36c, 36d and 36e.

As is illustrated in FIG. 3, the patterned photoresist layers 36a, 36b, 36c and 36d form a high areal density region R1 of the series of patterned photoresist layers, while the patterned photoresist layer 36e forms a low areal density region R2 of the series of patterned photoresist layers. As is similarly illustrated within FIG. 1, the patterned photoresist layers 36b, 36c, 36d and 36e each preferably has a linewidth W1 of from about 0.3 to about 0.4 microns. The patterned photoresist layers within the high areal density region R1 are similarly preferably separated by a pitch W2 of from about 0.3 to about 0.4 microns, while the patterned photoresist layer 36e within the low areal density region R2 is spaced from the nearest adjoining patterned photoresist layer 36d within the high areal density region R1 by a distance W3 of from about 3.0 to about 4.0 microns. Preferably each of the patterned photoresist layers 36a, 36b, 36c, 36d and 36e is from about 2500 to about 3000 angstroms thick.

Figure 4:
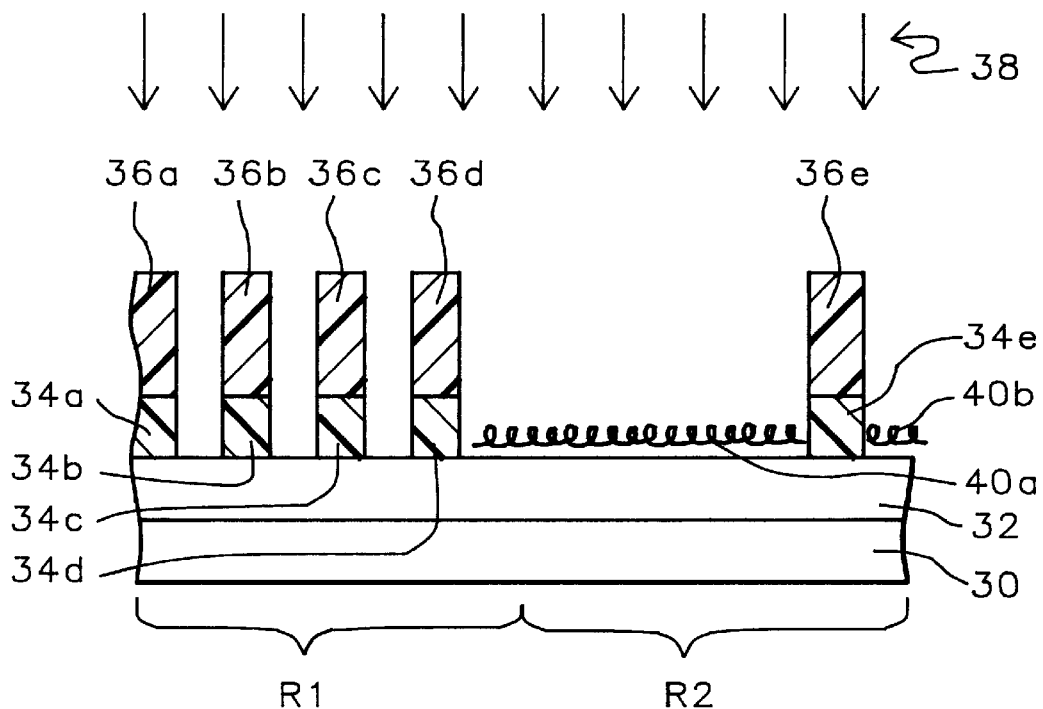

Referring now to FIG. 4, there is shown a schematic cross-sectional diagram illustrating the results of further processing of the microelectronics fabrication whose schematic cross-sectional diagram is illustrated in FIG. 3. Shown in FIG. 4 is a schematic cross-sectional diagram of a microelectronics fabrication otherwise equivalent to the microelectronics fabrication whose schematic cross-sectional diagram is illustrated in FIG. 3, but wherein the blanket organic polymer layer 34 has been patterned to form the patterned organic polymer layers 34a, 34b, 34c, 34d and 34e while reaching the blanket polysilicon layer 32, through etching with a first plasma 38 while employing the patterned photoresist layers 36a, 36b, 36c, 36d and 36e as etch mask layers. While etching the blanket organic polymer layer 34 to form the patterned organic polymer layers 34a, 34b, 34c, 34d and 34e, there is simultaneously formed upon the blanket polysilicon layer 32 within the low areal density region R2 of the patterned organic polymer layers a pair of organic polymer residue layers 40a and 40b. Within the first preferred embodiment of the present invention, the pair of organic polymer residue layers 40a and 40b suppress a micro-loading effect otherwise observed when subsequently plasma etching the blanket polysilicon layer 32 to form a patterned polysilicon layer having: (1) a high areal density region corresponding with the high areal density region R1 of the series of patterned photoresist layers and the series of patterned organic polymer layers, and (2) a low areal density region corresponding with the low areal density region R2 of the series of patterned photoresist layers and the series of patterned organic polymer layers. Within the first preferred embodiment of the present invention, an organic polymer residue layer, such as the organic polymer residue layers 40a and 40b is not appreciably formed upon the blanket polysilicon layer 32 within the high areal density region R1 of the patterned organic material layer.

Within the first preferred embodiment of the present invention, the composition of the organic polymer residue layers 40a and 40b, and their ability to suppress a micro-loading effect when subsequently plasma etching the blanket polysilicon layer 32, is determined in large part by the composition of a first etchant gas composition employed within the first plasma 38. In that regard, the first plasma 38 thus preferably employs the first etchant gas composition which facilitates formation of the organic polymer residue layers 40a and 40b. It has been found experimentally that when the first plasma 38 employs a first etchant gas composition which comprises an oxygen containing etchant source gas, a nitrogen containing etchant source gas and a bromine containing etchant source gas formation of the organic polymer residue layers 40a and 40b is adequately facilitated. Within the first preferred embodiment of the present invention, the oxygen containing etchant sorurce gas is preferably selected from the group of oxygen containing etchant source gases consisting of oxygen, ozone, nitrous oxide and nitric oxide. Similarly, within the first preferred embodiment of the present invention, the nitrogen containing etchant source gas is preferably selected from the group of nitrogen containing etchant source gases consisting of nitrogen and ammonia. Finally, within the first preferred embodiment of the present invention the bromine containing etchant source gas is preferably selected from the group of bromine containing etchant source gases consisting of hydrogen bromide and bromine. More preferably, the first plasma 38 employs the first etchant gas composition which consists essentially of the oxygen containing etchant source gas, the nitrogen containing etchant source gas and the bromine containing etchant source gas, employing the equivalent sets of selections as noted above for the oxygen containing etchant source gas, the nitrogen containing etchant source gas and the bromine containing etchant source gas. Yet more preferably, the first plasma 38 employs the first etchant gas composition comprising oxygen, nitrogen and hydrogen bromide. Most preferably, the first plasma employs the first etchant gas composition consisting essentially of oxygen, nitrogen and hydrogen bromide.

Preferably, the first plasma 38 also employs: (1) a reactor chamber pressure of from about 4.5 to about 5.5 mtorr; (2) an activating radio frequency plasma power of from about 225 to about 275 watts at a radio frequency of 13.56 MHZ and a bias radio power of about 180 to about 220 watts; (3) a substrate layer 30 temperature of from about 45 to about 55 degrees centigrade; (4) an oxygen flow rate of from about 9 to about 11 standard cubic centimeters per minute (sccm); (5) a nitrogen flow rate of from about 4.5 to about 5.5 standard cubic centimeters per minute (sccm); and (6) a hydrogen bromide flow rate of from about 45 to about 55 standard cubic centimeters per minute (sccm). Preferably, the first plasma 38 is employed for an etchant time determined by an endpoint detection method, plus about 23 to about 27 percent over-etch. Suitable endpoint detection methods include, but are not limited to optical emission spectroscopy (OES) endpoint detection methods and residual gas analysis (RGA) endpoint detection methods, as are known in the art.

Figure 5:
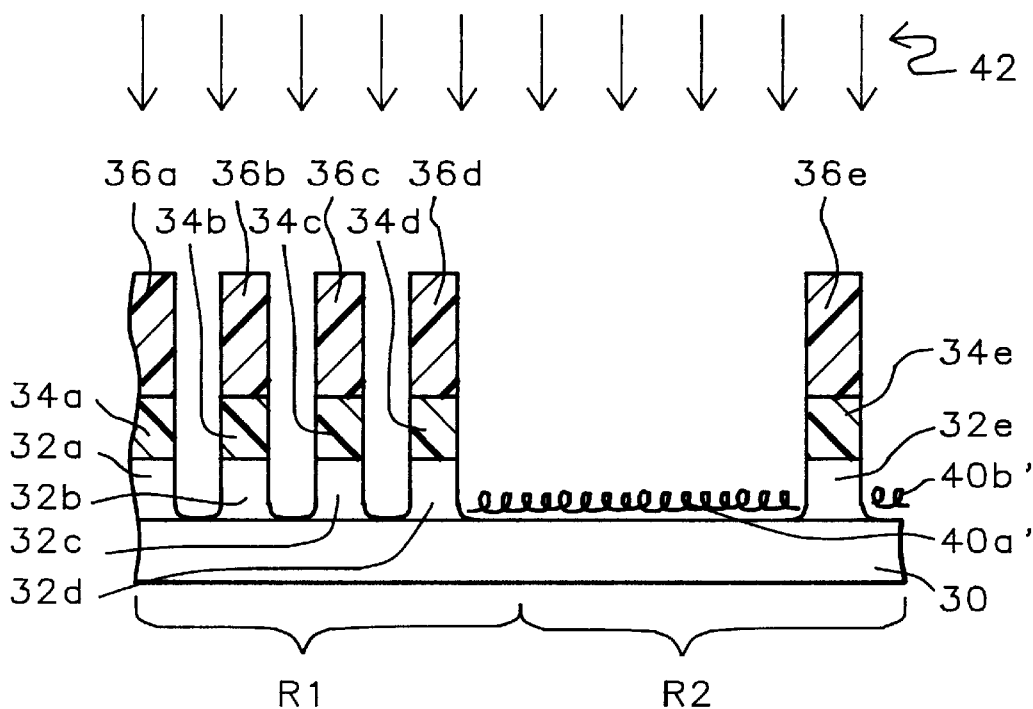

Referring now to FIG. 5, there is shown a schematic cross-sectional diagram illustrating the results of further processing of the microelectronics fabrication whose schematic cross-sectional diagram is illustrated in FIG. 4. Shown in FIG. 5 is a schematic cross-sectional diagram of a microelectronics fabrication otherwise equivalent to the microelectronics fabrication whose schematic cross-sectional diagram is illustrated in FIG. 4, but wherein the blanket polysilicon layer 32 has been patterned to form the nearly completely patterned polysilicon layers 32a, 32b, 32c, 32d and 32e while reaching the substrate layer 30, through etching within a second plasma 42. As is illustrated in FIG. 5, the organic polymer residue layers 40a and 40b are present through etching the blanket polysilicon layer within the second plasma 42 and remain within the low areal density region R2 of the patterned polysilicon layers as the extended organic polymer residue layers 40a' and 40b'. Within the first preferred embodiment of the present invention, the organic polymer residue layers 40a and 40b, and the extended organic polymer residue layers 40a' and 40b', suppress a micro-loading effect which would otherwise be manifested as under-etching of the nearly completely patterned polysilicon layers 32a, 32b, 32c and 32d within the high areal density region R1 of the patterned polysilicon layers and over-etching of the substrate layer 30 within the low areal density region R2 of the patterned polysilicon layers.

Within the first preferred embodiment of the present invention, the second plasma 42 employs a second etchant gas composition which preferably comprises a chlorine containing etchant source gas and a second bromine containing etchant source gas, along with a suitable optional diluent gas. More preferably, the second plasma 42 employs a second etchant gas composition which preferably consists essentially of a chlorine containing etchant source gas and a second bromine containing etchant source gas, along with a suitable optional diluent gas. Preferably, the chlorine containing etchant source gas is chosen from the group of chlorine containing etchant source gases consisting of chlorine and hydrogen chloride. Preferably, the second bromine containing etchant source gas is chosen from the group of bromine containing etchant source gases consisting of hydrogen bromide and bromine. Yet more preferably, the second plasma 42 employs a second etchant gas composition comprising chlorine and hydrogen bromide, along with a suitable diluent gas. Most preferably, the second plasma 42 employs a second etchant gas composition consisting essentially of chlorine and hydrogen bromide, along with a suitable diluent gas.

Preferably, the second plasma 42 also employs: (1) a reactor chamber pressure of from about 9 to about 11 mtorr; (2) an activating radio frequency power of from about 225 to about 275 watts at a radio frequency of 13.56 MHZ and a bias power of from about 180 to about 220 watts; (3) a substrate layer 30 temperature of from about 45 to about 55 degrees centigrade; (4) a chlorine flow rate of from about 72 to about 88 standard cubic centimeters per minute (sccm); (5) a hydrogen bromide flow rate of from about 108 to about 132 standard cubic centimeters per minute (sccm); and (6) a background helium flow rate of from about 45 to about 50 standard cubic centimeters per minute (sccm). Preferably, the second plasma 42 is employed for a time period determined by an endpoint detection method.

Figure 6:
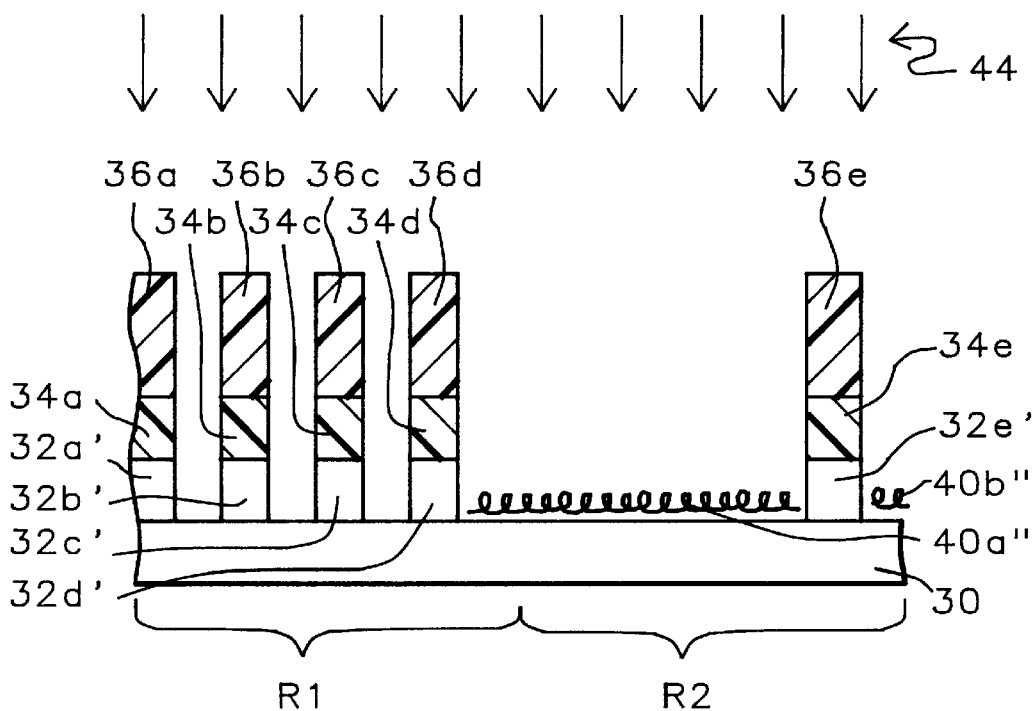

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram is illustrated in FIG. 5, but wherein the nearly completely patterned polysilicon layers 32a, 32b, 32c, 32d and 32e have been completely patterned to form the completely patterned polysilicon layers 32a', 32b', 32c', 32d' and 32e' through etching with a third plasma 44, while employing the corresponding patterned photoresist layers 36a, 36b, 36c, 36d and 36e, and the corresponding patterned organic polymer layers 34a, 34b, 34c, 34d and 34e, as etch mask layers. Simultaneously with etching the nearly completely patterned polysilicon layers 32a, 32b, 32c, 32d and 32e to form the completely patterned polysilicon layers 32a', 32b', 32c', 32d' and 32e', the extended organic polymer residue layers 40a' and 40b' remain upon the substrate layer 30 within the low areal density region R2 of the completely patterned polysilicon layers to form the further extended organic polymer residue layers 40a'' and 40b''.

Since the nearly completely etched patterned polysilicon layers 32a, 32b, 32c, 32d and 32e as illustrated in FIG. 5 are formed while attenuating a micro-loading effect, the use of the third plasma 44 within the first preferred embodiment of the present invention is optional. The use of the third plasma 44 nonetheless optimally defines the profile of the resulting completely patterned polysilicon layers 32a', 32b', 32c', 32d' and 32e', while simultaneously further suppressing over-etch damage to the substrate layer 30, particularly when the substrate layer 30 is formed of a dielectric material, as is common in the art of microelectronics fabrications.

Within the first preferred embodiment of the present invention, the third plasma 44 preferably employs a third etchant gas composition comprising a third bromine containing etchant source gas without a chlorine containing etchant source gas, along with a suitable diluent source gas. Preferably, the third bromine containing etchant source gas is chosen from the group of bromine containing etchant source gases consisting of hydrogen bromide and bromine. More preferably, the third etchant gas composition comprises hydrogen bromide, along with a suitable diluent source gas.

Preferably, the third plasma 44 also employs: (1) a reactor chamber pressure of from about 54 to about 66 mtorr; (2) an activating radio frequency power of from about 225 to about 275 watts at a radio frequency of 13.56 MHZ and a bias power of from about 162 to about 178 watts; (3) a substrate layer 30 temperature of from about 45 to about 55 degrees centigrade; (4) a hydrogen bromide flow rate of from about 180 to about 220 standard cubic centimeters per minute (sccm); (5) a helium diluent gas flow rate of from about 90 to about 100 standard cubic centimeters per minute (sccm); and (6) a helium:oxygen (70:30, vol:vol) additive gas flow of from about 3.0 to about 3.6 standard cubic centimeters per minute (sccm). Preferably, the completely patterned polysilicon layers 32a', 32b', 32c', 32d' and 32e' are formed through exposure of the nearly completely patterned polysilicon layers 32a, 32b, 32c, 32d and 32e to the third plasma 44 for an exposure time of from about 100 to about 180 seconds.

Figure 7:
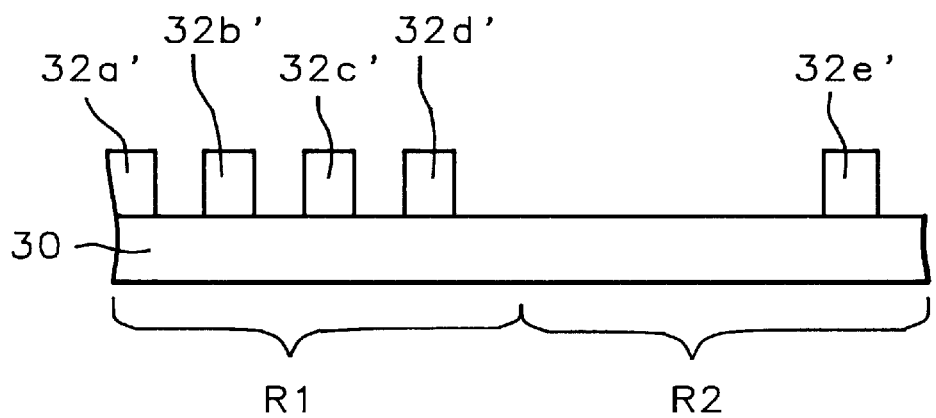

Referring now to FIG. 7, there is shown a schematic cross-sectional diagram illustrating the results of further processing of the microelectronics fabrication whose schematic cross-sectional diagram is illustrated in FIG. 6. Shown in FIG. 7 is a schematic cross-sectional diagram of a microelectronics fabrication otherwise equivalent to the microelectronics fabrication whose schematic cross-sectional diagram is illustrated in FIG. 6, but from whose surface has been stripped: (1) the patterned photoresist layers 36a, 36b, 36c, 36d and 36e; (2) the patterned organic polymer layers 34a, 34b, 34c, 34d and 34e; and (3) the further extended organic polymer residue layers 40a'' and 40b''. The foregoing patterned photoresist layers, patterned organic polymer layers and further extended organic polymer residue layers may be stripped from the surface of the microelectronics fabrication whose schematic cross-sectional diagram is illustrated in FIG. 6 to provide the microelectronics fabrication whose schematic cross-sectional diagram is illustrated in FIG. 7 through methods as are conventional in the art of microelectronics fabrication, which methods will typically include, but are not limited to, dry plasma oxygen stripping methods and wet chemical stripping methods.

Upon forming the microelectronics fabrication whose schematic cross-sectional diagram is illustrated in FIG. 7, there is formed a microelectronics fabrication having formed therein a patterned polysilicon layer having a high areal density region and a low areal density region, where the patterned polysilicon layer is formed while suppressing a micro-loading effect which would otherwise under-etch the patterned polysilicon layer within the high areal density region of the patterned polysilicon layer and over-etch the substrate layer upon which is formed the patterned polysilicon layer within the low areal density region of the patterned polysilicon layer.

Second Preferred Embodiment

Figure 8:
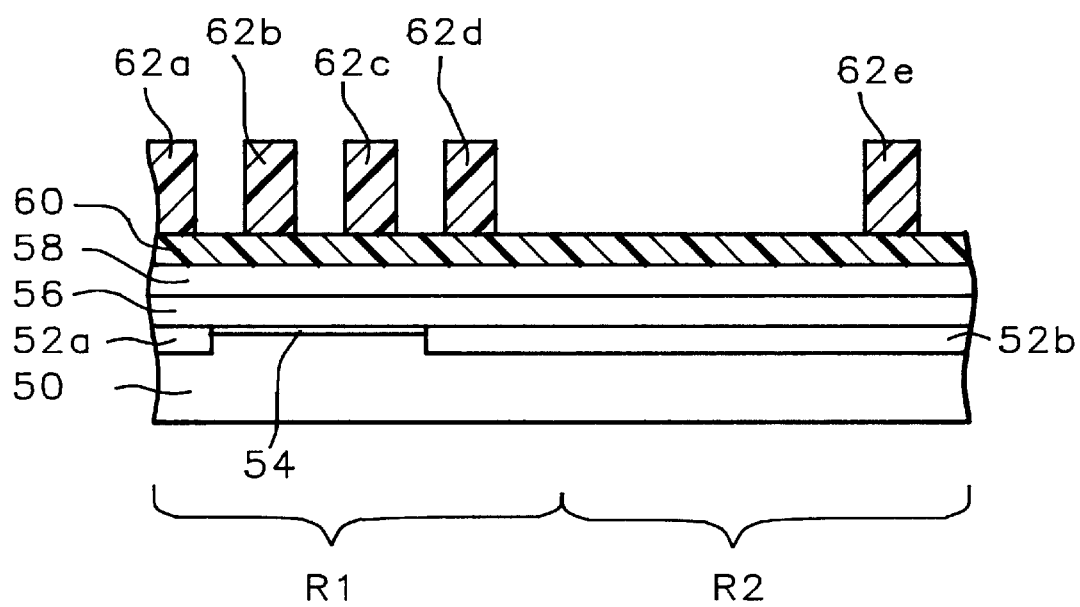
FIG. 8 to FIG. 13 show a series of schematic cross-sectional diagrams illustrating the results of progressive stages in forming within an integrated circuit microelectronics fabrication a pair of patterned polycide gate electrodes and a series of patterned polycide interconnect layers having a high areal density region and a low areal density region, while suppressing a micro-loading effect when forming the pair of patterned polycide gate electrodes and the series of patterned polycide interconnect layers, in accord with a more specific preferred embodiment of the present invention which comprises a second preferred embodiment of the present invention.

Referring now to FIG. 8 to FIG. 13, there is shown a series of schematic cross-sectional diagrams illustrating the results of progressive stages of forming in accord with a more specific preferred embodiment of the method of the present invention a pair of patterned polycide gate electrodes and a series of patterned polycide interconnects within an integrated circuit microelectronics fabrication, where the polycide gate electrodes and some of the patterned polycide interconnects are formed within a high areal density region and an other of the patterned polycide interconnects is formed within a low areal density region, while suppressing a micro-loading effect when forming the pair of polycide gate electrodes and the patterned polycide interconnects. The more specific preferred embodiment of the method of the present invention, as illustrated within FIG. 8 to FIG. 13, comprises a second preferred embodiment of the method of the present invention. Shown in FIG. 8 is a schematic cross-sectional diagram of the integrated circuit microelectronics fabrication at an early stage in its fabrication.

Shown in FIG. 8 is a semiconductor substrate 50 having formed within its surface a pair of isolation regions 52a and 52b which define an active region of the semiconductor substrate 50. Although it is known in the art of integrated circuit microelectronics fabrication that isolation regions may be formed within and/or upon a semiconductor substrate through methods including but not limited to isolation region thermal growth methods and isolation region deposition/patterning methods, for the second preferred embodiment of the present invention the isolation regions 52a and 52b are preferably formed within the semiconductor substrate 50 through a recessed oxide isolation (ROI) method to provide isolation regions 52a and 52b of silicon oxide nominally coplanar with the active region of the semiconductor substrate 50.

Shown also within FIG. 8, formed upon the active region of the semiconductor substrate 50 is a gate dielectric layer 54. Methods and materials through which gate dielectric layers may be formed within integrated circuit microelectronics fabrications are known in the art of integrated circuit microelectronics fabrication. Gate dielectric layers may be formed within integrated circuit microelectronics fabrications through methods including but not limited to gate dielectric layer thermal growth methods and gate dielectric layer deposition/patterning methods through which may be formed gate dielectric layers of dielectric materials including but not limited to silicon oxide dielectric materials and hardened silicon oxide dielectric materials. For the second preferred embodiment of the present invention, the gate dielectric layer 54 is preferably formed of a silicon oxide dielectric material formed through a thermal oxidation method to yield a gate dielectric layer 54 of thickness from about 63 to about 77 angstroms, as is common in the art of integrated circuit microelectronics fabrication.

There is also shown in FIG. 8 a series of three blanket layers formed over the semiconductor substrate 50, including the isolation regions 52a and 52b, and the gate dielectric layer 54. The series of three blanket layers includes: (1) a blanket polysilicon layer 56 formed upon the isolation regions 52a and 52b and the gate dielectric layer 54; (2) a blanket metal silicide layer 58 formed upon the blanket polysilicon layer 56; and (3) a blanket organic polymer layer 60 formed upon the blanket metal silicide layer 58. Within the integrated circuit microelectronics fabrication whose schematic cross-sectional diagram is illustrated in FIG. 8, the blanket polysilicon layer 56 and the blanket organic polymer layer 60 may be formed through methods and materials analogous or equivalent to the methods and materials employed in forming the blanket polysilicon layer 32 and the blanket organic polymer layer 34 within the first preferred embodiment of the present invention as illustrated within the microelectronics fabrication whose schematic cross-sectional diagram is illustrated in FIG. 3. Preferably the thickness of the blanket polysilicon layer 56 is from about 1350 to about 1450 angstroms, while the thickness of the blanket organic polymer layer 60 is from about 1350 to about 1450 angstroms.

With respect to the blanket metal silicide layer 58, methods and materials through which metal silicide layers may be formed within integrated circuit microelectronics fabrications are known in the art of integrated circuit microelectronics fabrication. Metal silicide layers may be formed within integrated circuit microelectronics fabrications through methods including but not limited to chemical vapor deposition (CVD) methods and metal deposition/thermal annealing methods through which may be formed metal silicide layers of metal silicides including but not limited to tungsten silicide, titanium silicide, molybdenum silicide, platinum silicide and cobalt silicide. For the second preferred embodiment of the present invention the blanket metal silicide layer 58 is preferably formed of tungsten silicide deposited through a chemical vapor deposition (CVD) method, as is common in the art of integrated circuit microelectronics fabrication, although other methods and materials may also be employed in forming the blanket metal silicide layer 58. Preferably, the blanket metal silicide layer 58 is from about 1025 to about 1375 angstroms thick.

Finally, there is shown in FIG. 8 a series of patterned photoresist layers 62a, 62b, 62c, 62d and 62e formed upon the blanket organic material layer 60. The series of patterned photoresist layers 62a, 62b, 62c, 62d and 62e as illustrated in FIG. 8 is preferably formed through methods and materials, and with dimensions, analogous or equivalent to the methods, materials and dimensions employed in forming the series of patterned photoresist layers 36a, 36b, 36c, 36d and 36e within the first preferred embodiment of the present invention, as illustrated in FIG. 3.

Figure 9:
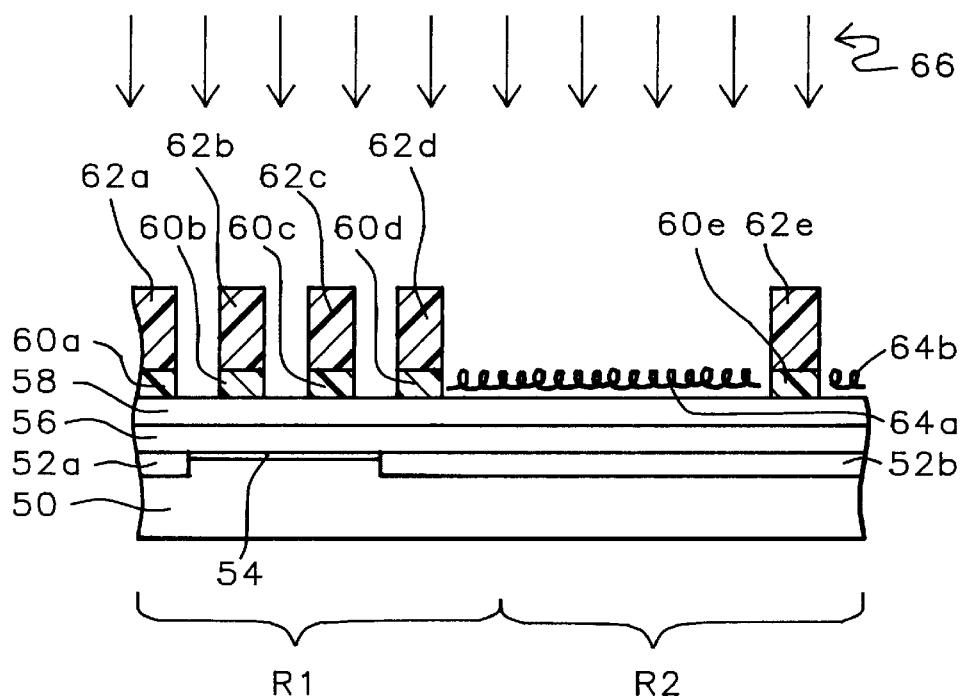

Referring now to FIG. 9, there is shown a schematic cross-sectional diagram illustrating the results of further processing of the integrated circuit microelectronics fabrication whose schematic cross-sectional diagram is illustrated in FIG. 8. Shown in FIG. 9 is an integrated circuit microelectronic fabrication otherwise equivalent to the integrated circuit microelectronics fabrication whose schematic cross-sectional diagram is illustrated in FIG. 8, but wherein the blanket organic polymer layer 60 has been patterned to form the patterned organic polymer layers 60*a*, 60*b*, 60*c*, 60*d* and 60*e*, while reaching the blanket metal silicide layer 58, through etching with a first plasma 66 while employing the patterned photoresist layers 62*a*, 62*b*, 62*c*, 62*d* and 62*e* as an etch mask layer. There is also shown within FIG. 9 formed upon the blanket metal silicide layer within a low density region R2 of the patterned photoresist layers a pair of organic polymer residue layers adjoining the patterned photoresist layer 62*e* and the patterned organic polymer layer 60*e*.

Within the integrated circuit microelectronics fabrication whose schematic cross-sectional diagram is illustrated in FIG. 9, the first plasma 66 is preferably formed through methods, materials and conditions analogous or equivalent to the methods, materials and conditions employed in forming the first plasma 38 employed within the first preferred embodiment of the present invention and illustrated within the schematic cross-sectional diagram of FIG. 4. Thus, the organic polymer residue layers 64*a* and 64*b* as illustrated within the schematic cross-sectional diagram of FIG. 9 are formed analogously or equivalently to the organic polymer residue layers 40*a* and 40*b* within the first preferred embodiment of the present invention as illustrated within the schematic cross-sectional diagram of FIG. 4.

Figure 10:
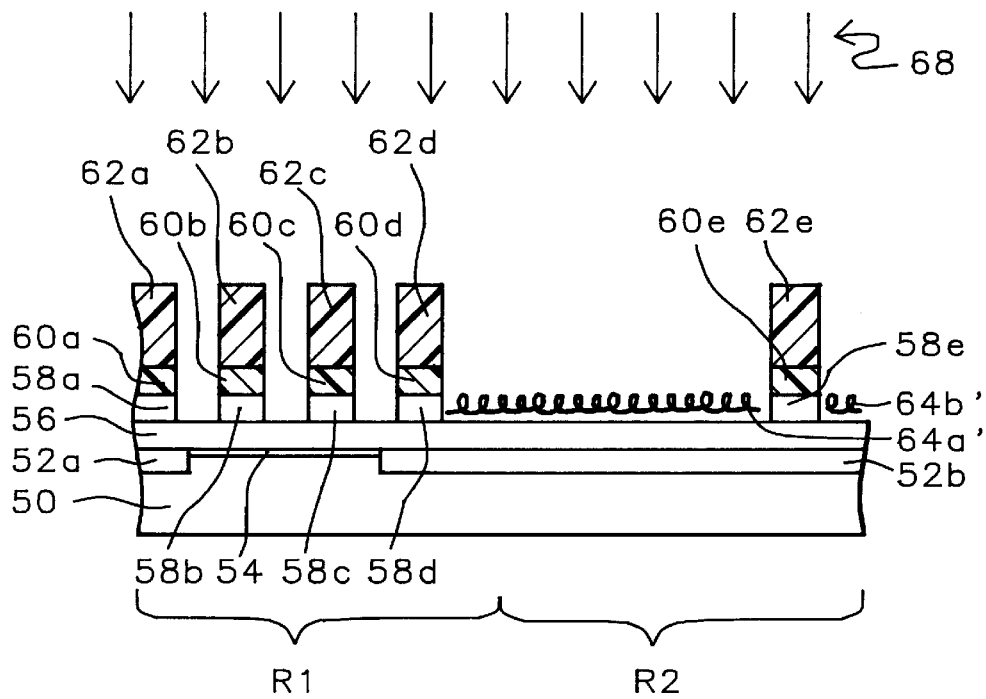

Referring now to FIG. 10, there is shown a schematic cross-sectional diagram illustrating the results of further processing of the integrated circuit microelectronics fabrication whose schematic cross-sectional diagram is illustrated in FIG. 9. Shown in FIG. 10 is a schematic cross-sectional diagram of an integrated circuit microelectronics fabrication otherwise equivalent to the integrated circuit microelectronics fabrication whose schematic cross-sectional diagram is illustrated in FIG. 9, but wherein the blanket metal silicide layer 58 has been patterned to form the patterned metal silicide layers 58*a*, 58*b*, 58*c*, 58*d* and 58*e*, while reaching the blanket polysilicon layer 56 and while employing the corresponding patterned photoresist layers 62*a*, 62*b*, 62*c*, 62*d* and 62*e* and the corresponding patterned organic material layers 60*a*, 60*b*, 60*c*, 60*d* and 60*e* as etch mask layers, through etching with a second plasma 68. When forming the patterned metal silicide layers 58*a*, 58*b*, 58*c*, 58*d* and 58*e* from the blanket metal silicide layer 58, the organic polymer residue layers 64*a* and 64*b* remain upon the blanket polysilicon layer 56 within the low areal density region R2 of the patterned organic polymer layers to form the extended organic polymer residue layers 64*a*' and 64*b*'.

Within the second preferred embodiment of the method of the present invention, where the blanket metal silicide layer is preferably formed of a tungsten silicide material, the second plasma 68 preferably employs a second etchant gas composition comprising a chlorine containing etchant source gas, along with optional diluent gases and minor additive gases. Preferably, the chlorine containing etchant source gas is chosen from the group of chlorine containing etchant source gases consisting of chlorine and hydrogen chloride. More preferably, the second etchant gas composition comprises chlorine. Yet more preferably, the second plasma 68 employs a breakthrough etch plasma and a main etch plasma, each of which employs a second etchant gas composition comprising chlorine.

Preferably, the second plasma 68 also employs: (1) a reactor chamber pressure of about 3.6 to about 4.4 mtorr; (2) a breakthrough etch activating radio frequency power of from about 225 to about 275 watts at a radio frequency of 13.56 MHZ and a breakthrough etch bias power of from about 135 to about 165 watts; (3) a main etch activating radio frequency power of from about 180 to about 220 watts at a radio frequency of 13.56 MHZ and a main etch bias power of from about 90 to about 110 watts; (4) a semiconductor substrate 50 temperature of from about 45 to about 55 degrees centigrade; (5) a breakthrough etch chlorine flow rate of from about 81 to about 99 standard cubic centimeters per minute (sccm) or a main etch chlorine flow rate of from about 99 to about 121 standard cubic centimeters per minute (sccm); and (6) a main etch added helium-oxygen (70:30 vol:vol) flow rate of from about 1.8 to about 2.2 standard cubic centimeters per minute (sccm). Preferably, the breakthrough etch is undertaken for a time period of from about 13 to about 17 seconds, while the main etch is undertaken for a time period determined by an endpoint detection method, plus about 40 to about 60 percent over-etch. Endpoint detection methods, may include, but are not limited to optical emission spectroscopy (OES) endpoint detection methods and residual gas analysis (RGA) endpoint detection methods, as are conventional in the art of integrated circuit microelectronics fabrication.

Figure 11:
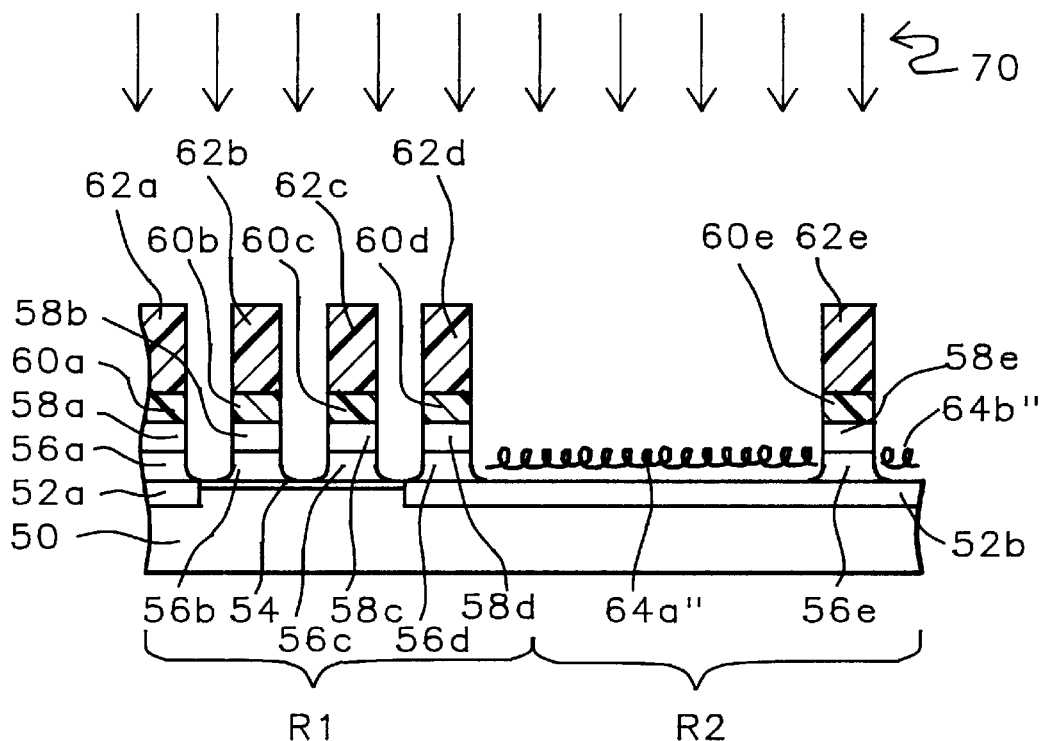

Referring now to FIG. 11, there is shown a schematic cross-sectional diagram illustrating the results of further processing of the integrated circuit microelectronics fabrication whose schematic cross-sectional diagram is illustrated in FIG. 10. Shown in FIG. 11 is a schematic cross-sectional diagram of an integrated circuit microelectronics fabrication otherwise equivalent to the integrated circuit microelectronics fabrication whose schematic cross-sectional diagram is illustrated in FIG. 10, but wherein the blanket polysilicon layer 56 has been nearly completely etched to form the nearly completely patterned polysilicon layer 56*a*, 56*b*, 56*c*, 56*d* and 56*e*, through etching within a third plasma 70 while employing the patterned photoresist layers 62*a*, 62*b*, 62*c*, 62*d* and 62*e*, the patterned organic material layers 60*a*, 60*b*, 60*c*, 60*d* and 60*e* and the patterned metal silicide layers 58*a*, 58*b*, 58*c*, 58*d* and 58*e* as etch mask layers. As is also illustrated in FIG. 11, the extended organic polymer residue layers 64*a*' and 64*b*' as illustrated in FIG. 10 are further extended to form the further extended organic polymer residue layers 64*a*" and 64*b*". Analogously with the first preferred embodiment of the present invention, the extended organic polymer residue layers 64*a*' and 64*b*' and the further extended organic polymer residue layers 64*a*" and 64*b*" within the second preferred embodiment of the present invention suppress a micro-loading effect which is manifested as an over-etching into the isolation region 52*b* within the low areal density region R2 of the nearly completely patterned polysilicon layers and an under-etching of the blanket polysilicon layer 56 when forming the nearly completely patterned polysilicon layers within the high areal density region R1 of the nearly completely patterned polysilicon layers.

Within the second preferred embodiment of the method of the present invention, the third plasma 70 is preferably formed through methods and materials, and employed under conditions, analogous or equivalent to the methods, materials and conditions employed in forming the second plasma 42 employed within the first preferred embodiment of the present invention, as illustrated in FIG. 5.

Figure 12:
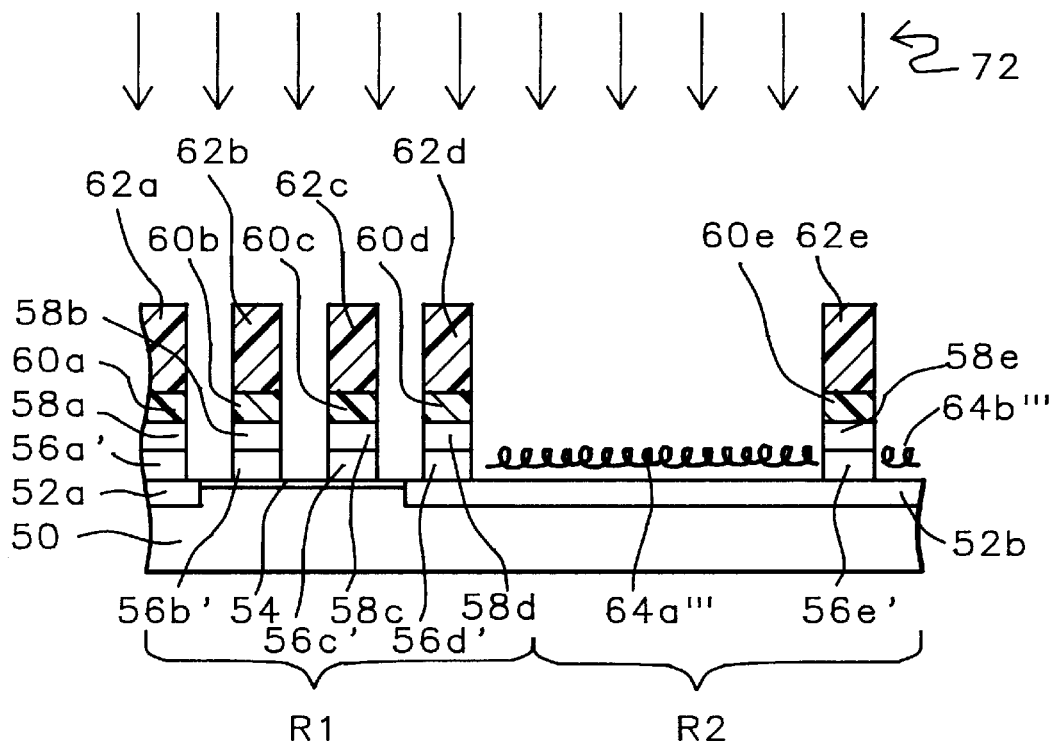

Referring now to FIG. 12, there is shown a schematic cross-sectional diagram illustrating the results of further processing the integrated circuit microelectronics fabrication whose schematic cross-sectional diagram is illustrated in FIG. 11. Shown in FIG. 12 is a schematic cross-sectional diagram of an integrated circuit microelectronics fabrication otherwise equivalent to the integrated circuit microelectronics fabrications whose schematic cross-sectional diagram is illustrated in FIG. 11, but wherein the nearly completely patterned polysilicon layers 56a, 56b, 56c, 56b and 56e are completely etched to form a series of completely patterned polysilicon layers 56a', 56b', 56c', 56d' and 56e' through etching within a fourth plasma 72. While etching within the fourth plasma 72 the nearly completely patterned polysilicon layers 56a, 56b, 56c, 56d and 56e to form the completely patterned polysilicon layers 56a', 56b', 56c', 56d' and 56e', the further extended organic polymer residue layers 64a" and 64b" are yet further extended to form the yet further extended organic polymer residue layers 64a'" and 64b'".

Within the second preferred embodiment of the present invention, the fourth plasma 72 is preferably formed through methods and materials, and employed under conditions, analogous or equivalent to the methods, materials and conditions employed in forming the third plasma 44 within the microelectronics fabrication of the first preferred embodiment of the present invention whose schematic cross-sectional diagram is illustrated in FIG. 6.

Figure 13:
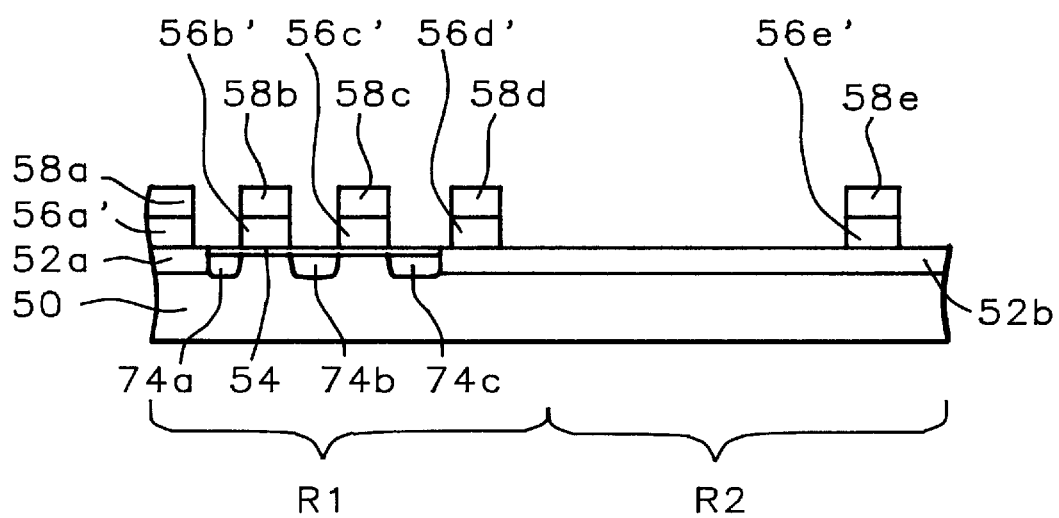

Referring now to FIG. 13, there is shown a schematic cross-sectional diagram illustrating the results of further processing of the integrated circuit microelectronics fabrication whose schematic cross-sectional diagram is illustrated in FIG. 12. Shown in FIG. 13 is a schematic cross-sectional diagram of an integrated circuit microelectronics fabrication otherwise equivalent to the integrated circuit microelectronics fabrication whose schematic cross-sectional diagram is illustrated in FIG. 12, but wherein the patterned photoresist layers 62a, 62b, 62c, 62d and 62e, the patterned organic material layers 60a, 60b, 60c, 60d and 60e, and the yet further extended organic polymer residue layers 64a'" and 64b'" have been stripped from the integrated circuit microelectronics fabrication. The foregoing patterned photoresist layers, patterned organic polymer layers and organic polymer residue layers may be stripped from the integrated circuit microelectronics fabrication whose schematic cross-sectional diagram is illustrated in FIG. 12 to form the integrated circuit microelectronics fabrication whose schematic cross-sectional diagram is illustrated in FIG. 13 through methods and materials analogous or equivalent to the methods and materials employed in stripping the corresponding patterned photoresist layers, patterned organic polymer layers and further extended organic polymer residue layers from the microelectronics fabrication whose schematic cross-sectional diagram is illustrated in FIG. 6 to form the microelectronics fabrication whose schematic cross-sectional diagram is illustrated in FIG. 7.

There is also shown within FIG. 13 formed within the active region of the semiconductor substrate 50 at areas not covered by the completely patterned polysilicon layers 56b' and 56c' and the patterned metal silicide layers 58b and 58c a series of source/drain regions 74a, 74b and 74c, thus forming within the active region of the semiconductor substrate 50 a pair of field effect transistors (FETs) which share the source/drain region 74b. The remaining completely patterned polysilicon layers 56a' and 56d', along with the corresponding remaining patterned metal silicide layers 58a and 58d, form patterned polycide local interconnect structures, while the remaining completely patterned polysilicon layer 56e' and the corresponding patterned metal silicide layer 58e form a patterned polycide global interconnect structure (i.e.: a bond pad) within the integrated circuit microelectronics fabrication whose schematic cross-sectional diagram is illustrated in FIG. 13.

Methods and materials through which source/drain regions may be formed within field effect transistors (FETs) within integrated circuit microelectronics fabrications are known within the art of integrated circuit microelectronics fabrication. Source/drain regions are typically formed within field effect transistors (FETs) within microelectronics fabrications through ion implantation methods employing dopant ions of polarity appropriate to the field effect transistors (FETs). For the second preferred embodiment of the method of the present invention, the source/drain regions 74a, 74b and 74c are preferably formed within the active region of the semiconductor substrate through an ion implantation method employing a suitable dopant ion at a ion implantation dose and an ion implantation energy as is conventional in the art of integrated circuit microelectronics fabrication.

Upon forming the integrated circuit microelectronics fabrication whose schematic cross-sectional diagram is illustrated in FIG. 13, there is formed an integrated circuit microelectronics fabrication having formed therein a patterned polycide layer formed of a patterned polysilicon layer and a patterned metal silicide layer. The patterned polycide layer so formed has a high areal density region and a low areal density region while suppressing a micro-loading effect when forming the patterned polycide layer.

As is understood by a person skilled in the art, both the first preferred embodiment of the present invention and the second preferred embodiment of the present invention employ plasma etch methods which are high density plasma (HDP) reactive ion etch (RIE) plasma etch methods (i.e.: they employ an activating radio frequency power along with a bias power) when forming a patterned polysilicon or a patterned polycide layer within a microelectronics fabrication or an integrated circuit microelectronics fabrication, while suppressing a micro-loading effect. The method of the present invention is not necessarily limited to high density plasma (HDP) reactive ion etch (RIE) plasma etch methods.

As is further understood by a person skilled in the art, although both the first preferred embodiment of the present invention and the second preferred embodiment of the present invention disclose multi-step plasma etch methods for forming within microelectronics fabrications such as integrated circuit microelectronics fabrications patterned polysilicon and patterned polycide layers with high areal density regions and low areal density regions, while suppressing a micro-loading effect, the multi-step plasma etch methods, although not specifically disclosed within the specification or drawings, are preferably undertaken sequentially in-situ within a single reactor chamber or within multiple interconnected reactor chambers absent atmospheric exposure, in order to provide optimal manufacturing efficiency and minimal adventitious contamination in forming the patterned polysilicon layers and the patterned polycide layers through the preferred embodiments of the present invention.

EXAMPLES

Upon the surfaces of two (100) silicon semiconductor substrates was formed a series of blanket layers including: (1) a blanket gate oxide layer of thickness about 70 angstroms formed through thermal oxidation of the semiconductor substrate; (2) a blanket doped polysilicon layer of thickness about 1500 angstroms formed upon the blanket gate oxide layer through a low pressure chemical vapor deposition (LPCVD) method; (3) a blanket tungsten silicide layer of thickness about 1250 angstroms formed upon the blanket doped polysilicon through a chemical vapor deposition (CVD) method employing a silane source material and a tungsten hexafluoride source material; and (4) a blanket organic polymer layer of thickness about 1500 angstroms formed upon the blanket tungsten silicide layer from an anti-reflective coating (ARC) polymer material. There was then formed upon each of the blanket organic polymer layers a patterned photoresist layer. Each of the two patterned photoresist layers had formed therein patterned positive photoresist structures of linewidth about 0.35 microns. The patterned positive photoresist structures upon each of the semiconductor substrates had a high areal density region of about 34 percent coverage over the semiconductor substrate and a low areal density region of about 4 percent coverage over the semiconductor substrate.

One of the two semiconductor substrates was then etched through a five step multi-step plasma etch method in accord with the second preferred embodiment of the present invention. The five step multi-step plasma etch method employed a first plasma employing a first etchant gas composition consisting of oxygen, nitrogen and hydrogen bromide to etch the blanket organic polymer layer and reach the blanket tungsten silicide layer while: (1) forming a patterned organic polymer layer having a high areal density region and a low areal density region: and (2) simultaneously forming an organic polymer residue layer upon the blanket tungsten silicide layer within the low areal density region of the patterned organic polymer layer. The first plasma also employed: (1) a reactor chamber pressure of about 5 mtorr; (2) an activating radio frequency power of 275 watts at a radio frequency of 13.56 MHZ and a bias power of about 250 watts; (3) a semiconductor substrate temperature of about 50 degrees centigrade; (4) an oxygen flow rate of about 10 standard cubic centimeters per minute (sccm); (5) a nitrogen flow rate of about 5 standard cubic centimeters per minute (sccm); and (6) a hydrogen bromide flow rate of about 50 standard cubic centimeters per minute (sccm), for a time determined by an optical emission spectroscopy (OES) endpoint plus about 25 percent over-etch (i.e.: total time about 40 seconds).

The five step multi-step plasma etch method also employed a second plasma employing a second etchant gas composition consisting of chlorine as a breakthrough etch in etching the blanket tungsten silicide layer. The second plasma also employed: (1) a reactor chamber pressure of about 4 mtorr; (2) an activating radio frequency power of about 250 watts at radio frequency of 13.56 MHZ and a bias power of about 150 watts; (3) a semiconductor substrate temperature of about 50 degrees centigrade; (4) a chlorine flow rate of about 90 cubic centimeters per minute (sccm), for a time period of about 10 seconds.

The five step multi-step plasma etch method also employed a third plasma employing a third etchant gas composition consisting of chlorine as a main etch in etching the blanket tungsten silicide layer to reach the blanket doped polysilicon layer. The third plasma also employed: (1) a reactor chamber pressure of about 4 mtorr; (2) an activating radio frequency power of about 200 watts at a radio frequency of 13.56 MHZ and a bias power of about 100 watts; (3) a semiconductor substrate temperature of about 50 degrees centigrade; (4) a chlorine flow rate of about 90 standard cubic centimeters per minute (sccm); and (5) an added helium:oxygen (50:50, vol:vol) flow rate of about 2 standard cubic centimeters per minute (sccm). The third plasma was employed for a time period determined through an optical emission spectra (OES) endpoint, plus about 15 seconds.

The five-step multi-step plasma etch method also employed a fourth plasma employing a fourth etchant gas composition consisting of chlorine and hydrogen bromide for nearly completely etching the blanket doped polysilicon layer. The fourth plasma also employed: (1) a reactor chamber pressure of about 20 mtorr; (2) an activating radio frequency power of about 250 watts at a radio frequency of 13.56 MHZ and a bias power of 200 watts; (3) a semiconductor substrate temperature of about 50 degrees centigrade; (4) a chlorine flow rate of about 80 standard cubic centimeters per minute (sccm); (5) a hydrogen bromide flow rate of about 120 standard cubic centimeters per minute; and (6) a background helium flow rate of about 50 standard cubic centimeters per minute (sccm), for a time period determined by an optical emission spectrum (OES) endpoint.

Finally, the five step multi-step plasma etch method also employed a fifth plasma employing a fifth etchant gas composition consisting of hydrogen bromide without chlorine for completely etching the nearly completely patterned doped polysilicon layers while not over-etching the blanket gate oxide layer. The fifth plasma also employed: (1) a reactor chamber pressure of about 60 mtorr; (2) an activating radio frequency power of about 250 watts at a radio frequency of 13.56 MHZ and a bias power of about 180 watts; (3) a semiconductor substrate temperature of about 50 degrees centigrade; (4) a hydrogen bromide flow rate of about 200 standard cubic centimeters per minute (sccm); (5) a background helium flow rate of about 100 standard cubic centimeters per minute (sccm); and (6) an added helium:oxygen (50:50, vol:vol) flow rate of about 3.3 standard cubic centimeters per minute (sccm). The fifth plasma was employed for a time period of about 140 seconds.

The series of blanket layers formed upon the second semiconductor substrate were etched within a five step multi-step plasma etch method under conditions and time periods otherwise equivalent to the conditions and time periods employed within the five step multi-step plasma etch method employed in etching the series of blanket layers formed upon the first semiconductor substrate, with the exception that there was not employed a nitrogen etchant source gas within the first etchant gas composition within the first plasma.

There was then measured the polysilicon layer thicknesses and polycide layer thickness within the high areal density regions and the low areal density regions of the patterned polycide layers formed upon each of the two semiconductor substrates, and there was also then calculated a micro-loading coefficient for the patterned polycide layers formed upon each of the two semiconductor substrates. The micro-loading coefficient was calculated as: ((polysilicon layer thickness etched in high areal density region-polysilicon layer thickness etched in low areal density region)/original polysilicon layer thickness). The micro-loading coefficient for the patterned polycide layer formed through the five step multi-step plasma etch method undertaken in accord with the second preferred embodiment of the present invention calculated as a micro-loading coefficient of less than about 10 percent, while the micro-loading coefficient for the patterned polycide layer formed through the five-step multi-step plasma etch method in accord with the second preferred embodiment of the present invention, but without the nitrogen etchant source gas within the first etchant gas composition within the first plasma within the five step multi-step plasma etch method calculated as a micro-loading coefficient of greater than about 20 percent.

As is seen from the foregoing data, incorporation of a nitrogen etchant source gas within an organic polymer layer plasma etch method in accord with the first preferred embodiment of the present invention or the second preferred embodiment of the present invention when forming a patterned polysilicon layer from a blanket polysilicon layer or a patterned polycide layer from a blanket polycide layer forms the patterned polysilicon layer or the patterned polycide layer when having a high areal density region and a low areal density region, while suppressing a micro-loading effect.

What is claimed is:

1. A method for forming a patterned polysilicon layer within a microelectronics fabrication comprising:

providing a substrate layer employed within a microelectronics fabrication;

forming upon the substrate layer a blanket polysilicon layer;

forming upon the blanket polysilicon layer a blanket organic polymer layer;

forming upon the blanket organic polymer layer a patterned photoresist layer, the patterned photoresist layer having a high areal density region and a low areal density region;

etching through a first plasma etch method while employing the patterned photoresist layer as a photoresist etch mask layer the blanket organic polymer layer to form a patterned organic polymer layer while reaching the blanket polysilicon layer, the patterned organic polymer layer having a high areal density region corresponding with the high areal density region of the patterned photoresist layer and a low areal density region corresponding with the low areal density region of the patterned photoresist layer, the blanket polysilicon layer having formed thereupon an organic polymer residue layer within the low areal density region of the patterned organic polymer layer, the first plasma etch method employing a first etchant gas composition comprising an oxygen containing etchant source gas, a nitrogen containing etchant source gas and a bromine containing etchant source gas; and etching through a second plasma etch method while employing at least the patterned organic polymer layer as an etch mask layer the blanket polysilicon layer to form a patterned polysilicon layer, the patterned polysilicon layer having a high areal density region corresponding with the high areal density region of the patterned photoresist layer and a low areal density region corresponding with the low areal density region of the patterned photoresist layer.

2. The method of claim 1 wherein the patterned polysilicon layer is formed while suppressing a micro-loading effect manifested as underetching of the patterned polysilicon layer within the high areal density region of the patterned polysilicon layer and overetching the substrate layer within the low areal density region of the patterned polysilicon layer.

3. The method of claim 2 wherein the organic polymer residue layer suppresses the micro-loading effect.

4. The method of claim 1 wherein the microelectronics fabrication is chosen from the group of microelectronics fabrications consisting of integrated circuit microelectronics fabrications, solar cell microelectronics fabrications, ceramic substrate microelectronics fabrications and flat panel display microelectronics fabrications.

5. The method of claim 1 wherein the blanket organic polymer layer is formed from an organic polymer material chosen from the group of organic polymer materials consisting of planarizing organic polymer materials, encapsulating organic polymer materials and anti-reflective dyed organic polymer materials.

6. The method of claim 1 wherein the blanket organic polymer layer is formed from an anti-reflective dyed organic polymer material selected from the group consisting of dyed polyimide polymer materials and dyed non-photoreactive resist polymer materials.

7. The method of claim 1 wherein the second plasma etch method employs a second etchant gas composition comprising a chlorine containing etchant source gas and a second bromine containing etchant source gas.

8. The method of claim 7 wherein:

the oxygen containing etchant source gas is chosen from the group consisting of oxygen, ozone, nitrous oxide and nitric oxide;

the nitrogen containing etchant source gas is chosen from the group consisting of nitrogen and ammonia;

the bromine containing etchant source gas is chosen from the group consisting of hydrogen bromide and bromine;

the chlorine containing etchant source gas is chosen from the group consisting of chlorine and hydrogen chloride; and the second bromine etchant source gas is chosen from the group consisting of hydrogen bromide and bromine.

9. The method of claim 7 wherein:

the first etchant gas composition comprises oxygen, nitrogen and hydrogen bromide; and the second etchant gas composition comprises chlorine and hydrogen bromide.

10. The method of claim 1 further comprising overetching through a third plasma etch method while employing at least the patterned organic polymer layer as an etch mask layer the patterned polysilicon layer, the third plasma etch method employing a third etchant gas composition comprising a third bromine containing etchant source gas without a chlorine containing etchant source gas.

11. The method of claim 10 wherein the third bromine containing etchant source gas is chosen from the group consisting of hydrogen bromide and bromine.

12. A microelectronics fabrication having formed therein a patterned polysilicon layer formed in accord with the method of claim 1.

13. A method for forming a patterned polycide layer within a microelectronics fabrication comprising:

providing a substrate layer employed within a microelectronics fabrication;

forming upon the substrate layer a blanket polysilicon layer;

forming upon the blanket polysilicon layer a blanket metal silicide layer;

forming upon the blanket metal silicide layer a blanket organic polymer layer;

forming upon the blanket organic polymer layer a patterned photoresist layer, the patterned photoresist layer having a high areal density region and a low areal density region;

etching through a first plasma etch method while employing the patterned photoresist layer as a photoresist etch mask layer the blanket organic polymer layer to form a patterned organic polymer layer while reaching the blanket metal silicide layer, the patterned organic polymer layer having a high areal density region corresponding with the high areal density region of the patterned photoresist layer and a low areal density region corresponding with the low areal density region of the patterned photoresist layer, the blanket metal silicide layer having formed thereupon an organic polymer residue layer within the low areal density region of the patterned organic polymer layer, the first plasma etch method employing a first etchant gas composition comprising an oxygen containing etchant source gas, a nitrogen containing etchant source gas and a bromine containing etchant source gas;

etching through a second plasma etch method while employing at least the patterned organic polymer layer as an etch mask layer the blanket metal silicide to form a patterned metal silicide layer while reaching the blanket polysilicon layer, the blanket metal silicide layer having a high areal density region of the patterned metal silicide layer corresponding with the high areal density region of the patterned photoresist layer and a low areal density region of the patterned metal silicide layer corresponding with the low areal density region of the patterned photoresist layer; and etching through a third plasma etch method while employing at least the patterned metal silicide layer as an etch mask layer the blanket polysilicon layer to form a patterned polysilicon layer, the patterned polysilicon layer having a high areal density region corresponding with the high areal density region of the patterned photoresist layer and a low areal density region corresponding with the low areal density region of the patterned photoresist layer.

14. The method of claim 13 wherein the patterned polysilicon layer is formed while suppressing a micro-loading effect manifested as an underetching the patterned polysilicon layer within the high areal density region of the patterned polysilicon layer and an overetching of the substrate layer within the low areal density region of the patterned polysilicon layer.

15. The method of claim 14 wherein the organic polymer residue layer suppresses the micro-loading effect.

16. The method of claim 13 wherein the microelectronics fabrication is chosen from the group of microelectronics fabrications consisting of integrated circuit microelectronics fabrications, solar cell microelectronics fabrications, ceramic packaging microelectronics fabrications and flat panel display microelectronics fabrications.

17. The method of claim 13 wherein the blanket organic polymer layer is formed from an organic polymer material chosen from the group of organic polymer materials consisting of planarizing organic polymer materials, encapsulating organic polymer materials and anti-reflective dyed organic polymer materials.

18. The method of claim 13 wherein the blanket organic polymer layer is formed from an anti-reflective dyed organic polymer material selected from the group consisting of dyed polyimide polymer materials and dyed non-photoreactive resist polymer materials.

19. The method of claim 13 wherein the third plasma etch method employs a third etchant gas composition comprising a chlorine containing etchant source gas and a second bromine containing etchant source gas.

20. The method of claim 19 wherein:

the oxygen containing etchant source gas is chosen from the group consisting of oxygen, ozone, nitrous oxide and nitric oxide;

the nitrogen containing etchant source gas is chosen from the group consisting of nitrogen and ammonia;

the bromine containing etchant source gas is chosen from the group consisting of hydrogen bromide and bromine;

the chlorine containing etchant source gas is chosen from the group consisting of chlorine and hydrogen chloride; and the second bromine containing etchant source gas is chosen from the group consisting of hydrogen bromide and bromine.

21. The method of claim 19 wherein:

the first etchant gas composition comprises oxygen, nitrogen and hydrogen bromide; and the third etchant gas composition comprises chlorine and hydrogen bromide.

22. The method of claim 13 further comprising overetching through a fourth plasma etch method while employing at least the patterned metal silicide layer as an etch mask layer the patterned polysilicon layer, the fourth plasma etch method employing a fourth etchant gas composition comprising a third bromine containing etchant source gas without a chlorine containing etchant source gas.

23. The method of claim 22 wherein the third bromine containing etchant source gas is chosen from the group consisting of hydrogen bromide and bromine.

24. A microelectronics fabrication having formed therein a patterned polycide layer formed in accord with the method of claim 13.

* * * * *